United States Patent
Schmitt

(10) Patent No.: US 8,259,517 B2
(45) Date of Patent: *Sep. 4, 2012

(54) RANDOM ACCESS MEMORY FOR USE IN AN EMULATION ENVIRONMENT

(75) Inventor: Peer Schmitt, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/854,747

(22) Filed: Aug. 11, 2010

(65) Prior Publication Data

US 2010/0302882 A1 Dec. 2, 2010

Related U.S. Application Data

(63) Continuation of application No. 12/093,941, filed as application No. PCT/EP2007/051648 on Feb. 21, 2007, now Pat. No. 7,826,282.

(60) Provisional application No. 60/775,596, filed on Feb. 21, 2006.

(51) Int. Cl.
*G11C 7/00* (2006.01)

(52) U.S. Cl. ............ 365/189.17; 365/189.2; 365/230.04; 365/156; 365/154; 365/194; 365/236; 703/23

(58) Field of Classification Search ............. 365/233.12, 365/233.1, 230.04, 189.02, 189.04, 189.17, 365/189.2, 156, 154, 194, 236; 703/23
See application file for complete search history.

(56) References Cited

U.S. PATENT DOCUMENTS

| | | | |
|---|---|---|---|
| 6,128,243 A * | 10/2000 | Chan et al. | 365/227 |
| 6,381,184 B2 | 4/2002 | Duesman | |
| 7,072,237 B2 | 7/2006 | Morgan et al. | |
| 7,826,282 B2 * | 11/2010 | Schmitt | 365/189.17 |
| 8,108,198 B2 * | 1/2012 | Schmitt et al. | 703/22 |
| 2005/0185477 A1 | 8/2005 | Aoki et al. | |

FOREIGN PATENT DOCUMENTS

| | | |
|---|---|---|
| EP | 214050 | 3/1987 |
| EP | 237337 | 9/1987 |
| EP | 883131 | 12/1998 |

* cited by examiner

*Primary Examiner* — Andrew Q Tran
(74) *Attorney, Agent, or Firm* — Klarquist Sparkman, LLP

(57) ABSTRACT

A Random Access Memory (RAM) and method of using the same are disclosed. The RAM includes a plurality of memory cells arranged in columns and in rows with each memory cell coupled to at least one word line and at least one bit line. The RAM includes a plurality of switches with at least one of the switches coupled between two of the memory cells to allow data to be copied from one of the two memory cells to the other of the two memory cells. In another aspect, the two memory cells can be considered a dual bit cell that contains a copying mechanism. There are two interleaved memory planes, assembled from bit cells that contain two bits of information. One bit is the primary bit that corresponds to the normal RAM bit. The second bit is able to receive a copy and hold the primary value. When the copying mechanism is over, the two memory planes may act as two completely independent structures.

15 Claims, 11 Drawing Sheets

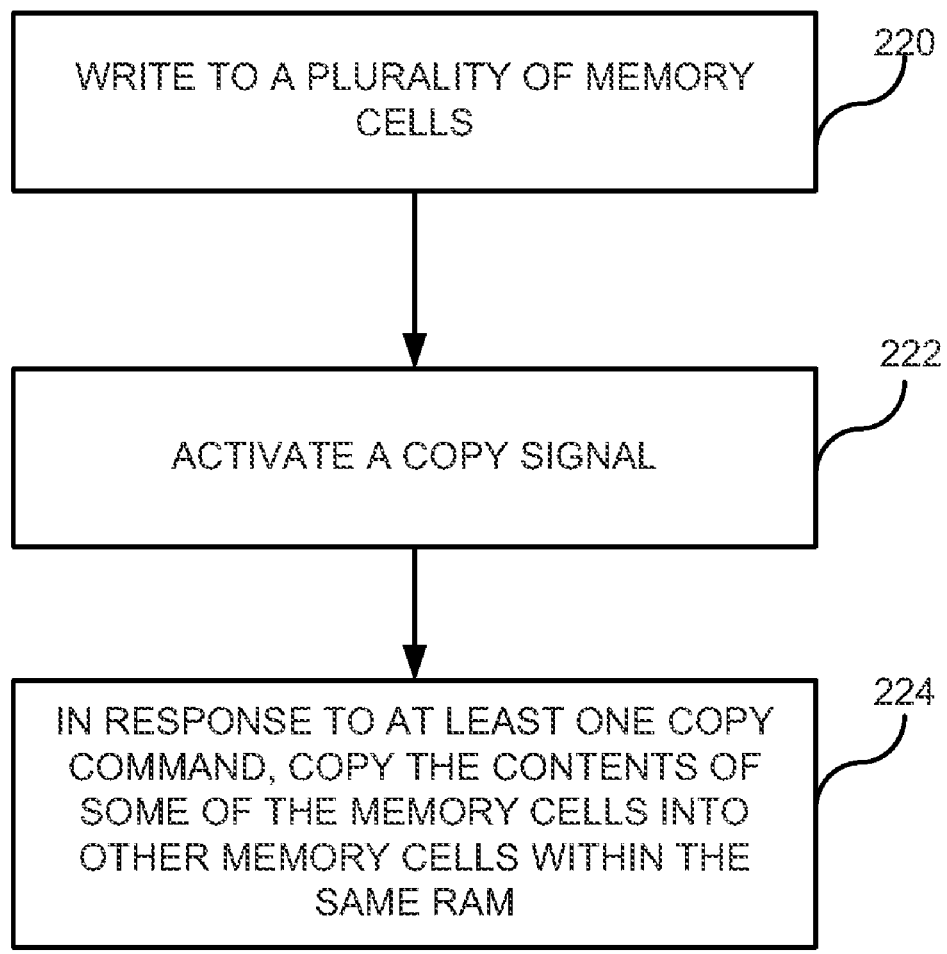

RANDOM ACCESS MEMORY FOR USE IN AN EMULATION ENVIRONMENT

RELATED APPLICATION DATA

This is a continuation of U.S. patent application Ser. No. 12/093,941, filed May 15, 2008, now U.S. Pat. No. 7,826,282 which claims priority to International Application No. PCT/EP2007/051648, filed Feb. 21, 2007, which claims priority to U.S. Provisional Application No. 60/775,596, filed on Feb. 21, 2006. All referenced applications are incorporated entirely herein by reference.

FIELD OF THE INVENTION

The present invention generally relates to hardware emulators, and more particularly to a memory used in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Once the design is loaded and running in the hardware emulator, it is desirable to obtain trace data of the states of the various design state elements and/or other design elements and/or design signals. Such trace data, also known as user visibility data, is made available to the user and is often used to debug a design. Unfortunately, as the number of state elements increases, so to does the amount of trace data. For example, an FPGA emulating one hundred thousand state elements could generate up to one hundred thousand bits, or 0.1 Mb, of trace data per clock cycle.

The elements that are traced can be divided into three main categories: flip-flops, glue logic, and RAM. Each of these categories has its own unique tracing problems, but all are limited by the size of a trace buffer into which data is stored. Because of the large amount of data needed to be captured over a large number of clock cycles, some elements are captured only at pre-determined intervals (e.g., every 1000 clock cycles) and if a user requests to view a particular interval, any uncaptured cycles can be simulated and regenerated in order to complete the entire trace period. For example, flip-flops may be captured once every 1000 cycles and that captured data may be used to simulate the other flip-flop states as well as the glue logic.

While such simulation works well with flip-flops and glue logic, memory must be captured every clock cycle. For example, a user wanting to view the contents of memory at a particular trace cycle cannot rely on simulation generated using a memory captured only once every 1000 cycles. If the memory contents change every cycle, such changes will be lost and unrecoverable. Another difficult issue with memory is the manner of tracing used. During emulation, the memory is constantly accessed. In order to view the memory, it is not possible to switch off the memory or the emulator and download the memory contents. Thus, current systems monitor the memory ports in order to trace changes that occurred in the memory, similar to shadow memories known in the art. Knowledge of the original contents of memory and how it changed can be used to accurately recreate the memory contents.

A problem with tracing read ports is that every user cycle, memory data continuously accumulates until a cross-over point where the data captured to duplicate the memory exceeds the memory size itself. Continued tracing beyond the cross-over point means that it would have been more efficient to have a duplicate memory. Additionally, as user designs continue to become larger and more complex, the memory size is increasing, requiring the trace buffer to monitor more memory ports. With this trend continuing, it is desirable to re-think how memory can be more efficiently traced without over-burdening the trace system.

SUMMARY

A Random Access Memory (RAM) and method of using the same are disclosed. The RAM includes a plurality of memory cells arranged in columns and in rows with each memory cell coupled to at least one word line and at least one bit line. The intersection of a word line and a bit line constitutes an address of the memory cell. The RAM includes a plurality of switches with at least one of the switches coupled between two of the memory cells to allow data to be copied from one of the two memory cells to the other of the two memory cells.

In another aspect, all of the memory cells in the RAM may be so copied during one emulator clock cycle into adjacent memory cells. The adjacent memory cells thereby formulate a snapshot memory. The snapshot memory may be used to capture the primary contents of the RAM (at a given moment in time) and download those contents to the trace memory without interrupting the operation of the RAM so far as the user system is concerned.

In yet another aspect, two memory cells can be considered a dual bit cell that contains a copying mechanism. There are two interleaved memory planes, assembled from memory cells that contain two bits of information. One bit is the primary bit that corresponds to the normal RAM bit. The second bit is able to receive a copy and hold the primary value. When the copying mechanism is over, the two memory planes may act as two completely independent structures.

These features and others of the described embodiments will be more readily apparent from the following detailed description, which proceeds with reference to the accompanying drawings.

BRIEF DESCRIPTION OF THE DRAWINGS

FIG. 4 shows the RAM of FIG. 3 in more detail including an array of memory cells with switches coupled there between.

FIG. 12 shows a flowchart of a method for performing a copy between memory cells within the RAM.

DETAILED DESCRIPTION

Figure 1:
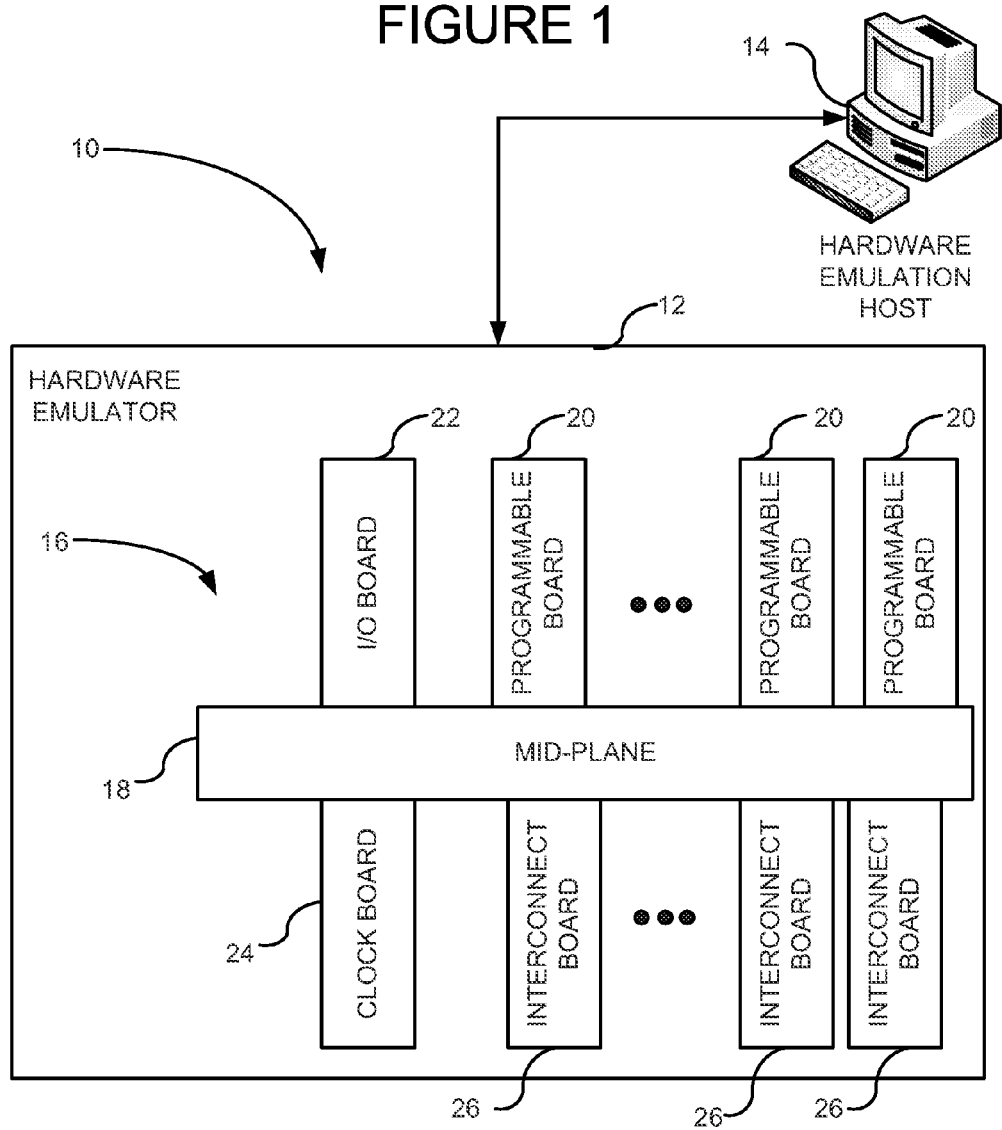
FIG. 1 is a system diagram of a hardware emulator environment.

FIG. 1 shows an emulator environment 10 including a hardware emulator 12 coupled to a hardware emulator host 14. The emulator host 14 may be any desired type of computer hardware and generally includes a user interface through which a user can load, compile and download a design to the emulator 12 for emulation.

The emulator 12 includes multiple printed circuit boards 16 coupled to a midplane 18. The midplane 18 allows physical connection of the printed circuit boards into the emulator 12 on both sides of the midplane. A backplane may also be used in place of the midplane, the backplane allowing connection of printed circuit boards on one side of the backplane. Any desired type of printed circuit boards may be used. For example, programmable boards 20 generally include an array of FPGAs, or other programmable circuitry, that may be programmed with the user's design downloaded from the emulator host 14. One or more I/O boards 22 allow communication between the emulator 12 and hardware external to the emulator. For example, the user may have a preexisting processor board that is used in conjunction with the emulator and such a processor board connects to the emulator through I/O board 22. Clock board 24 generates any number of desired clock signals. And interconnect boards 26 allow integrated circuits on the programmable boards 20 to communicate together and with integrated circuits on the I/O boards 22.

Figure 2:
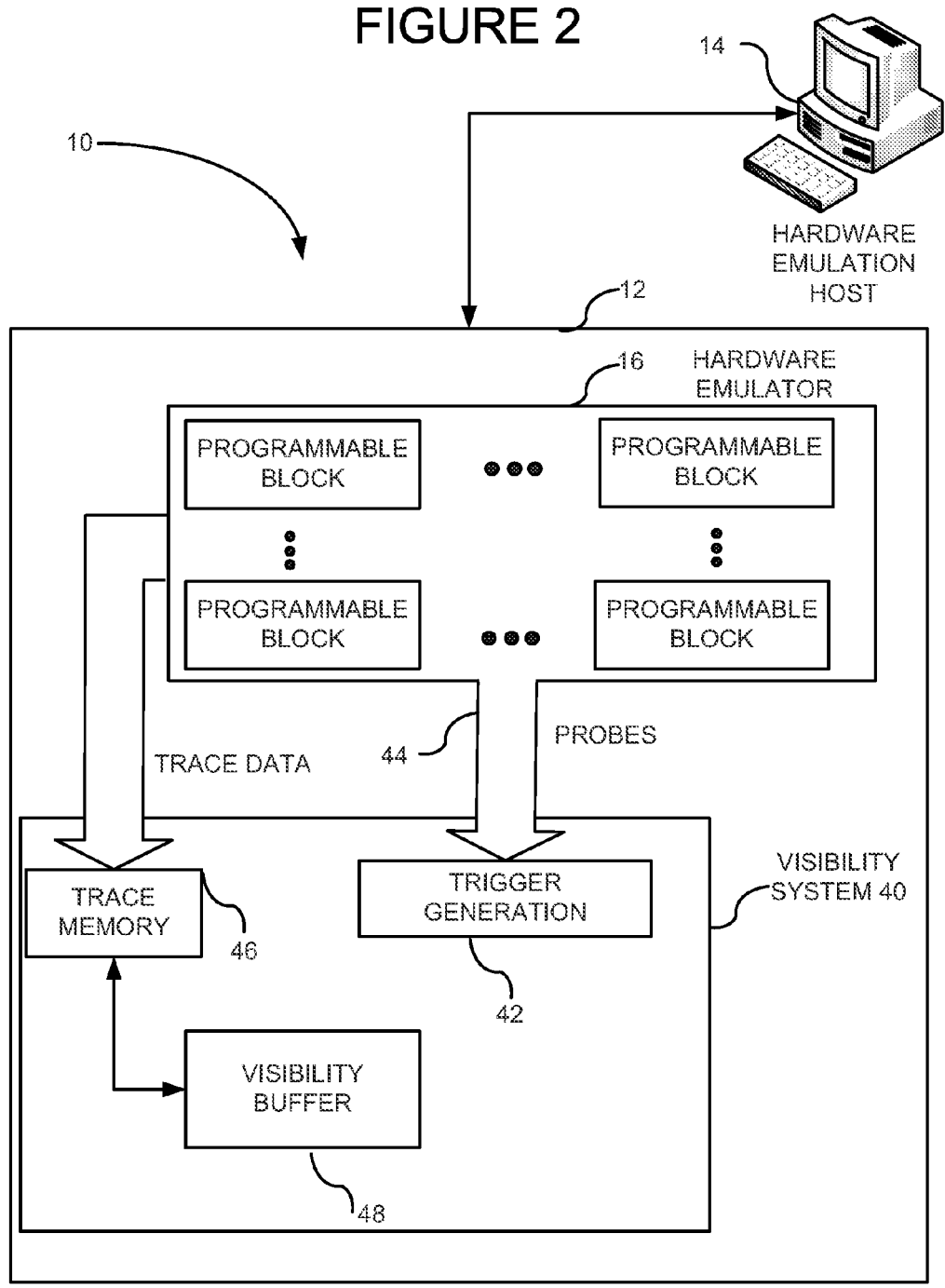
FIG. 2 shows details of a visibility system in the hardware emulator of FIG. 1.

FIG. 2 shows further details of one of the printed circuit boards 16 and the interaction with a visibility system 40. The visibility system allows a user to set certain events or triggers 42 detected through probes 44 coupled to the printed circuit board 16. If a trigger is activated, data related to the board's operation is stored in a trace memory 46. A visibility buffer 48 is coupled to the trace memory and is used by software on the emulation host 14 to display the trace results to the user.

Figure 3:
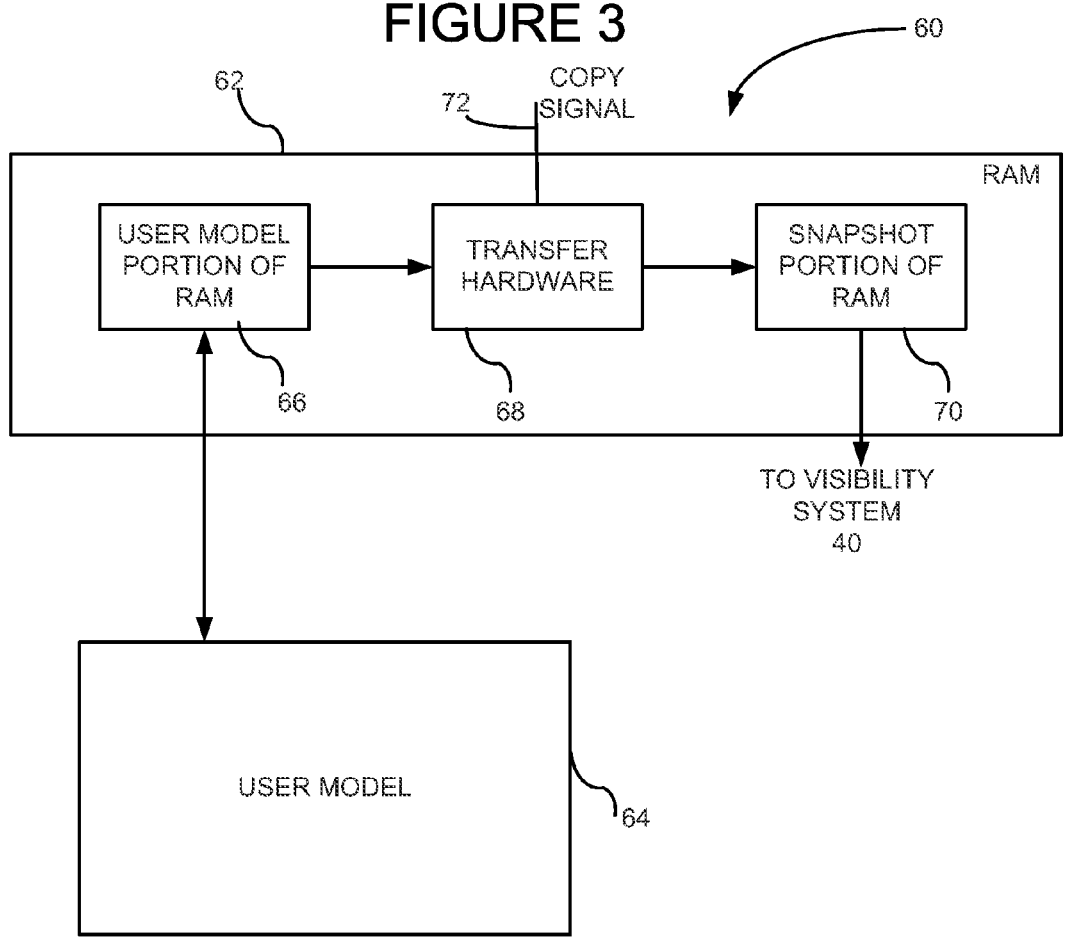
FIG. 3 shows a relationship between RAM, a user model and the visibility system.

FIG. 3 shows a high-level diagram 60 showing the interaction between a RAM 62 located on one of the printed circuit boards 16, a user model 64 and the visibility system 40. The user model 64 represents the system being emulated in the hardware emulator 12 by the user. The user model 64 accesses RAM 62, which includes a user model portion 66, transfer hardware 68, and a snapshot portion 70. The user model portion 66 is directly readable and writeable by the user model 64. However, in order to not overburden the visibility system, the visibility system 40 accesses the user model portion 66 via the snapshot portion 70. At any desired moment in time, a copy signal line 72 coupled to the transfer hardware 68 can effectuate a block copy of the contents of the user model portion 66 of the RAM 62 to the snapshot portion 70. These contents can then be downloaded to the visibility system over many clock cycles and show the state of the user model portion 66 at substantially the moment of activation of the copy signal.

Figure 4:
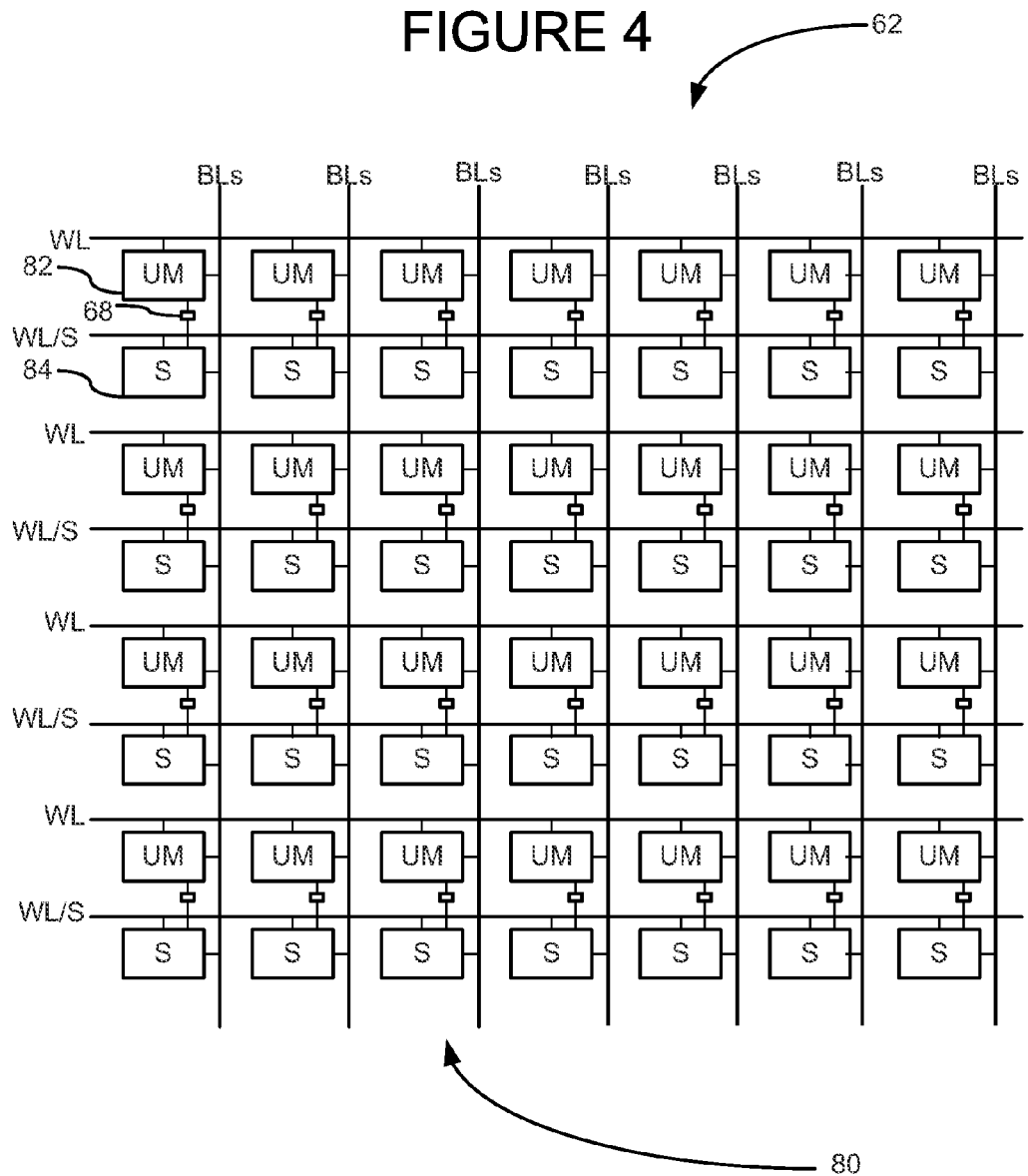

FIG. 4 is a hardware diagram of the RAM 62 in more detail. The RAM has an array 80 of memory cells formed in multiple rows and columns. Each memory cell 80 is addressed by the intersection of one or more bit lines (BLs) and word lines (WL or WL/S). The RAM has two different types of memory cells (e.g., 82 and 84), although in other embodiments, all memory cells may be identical. One type of memory cell 82 is designated "UM" to indicate that it is within the user model portion 66 of the RAM 62. The other memory cell 84 is designated "S" to indicate that it is within the snapshot portion 70 of the RAM 62. The two different types of memory cells are interleaved so that there are alternating rows of cells of type UM and cells of type S. The transfer hardware 68 is shown coupled between the rows and, more specifically, between a memory cell of type UM and of type S. The transfer hardware 68 is a simple switch coupled to the copy line 72 (not shown in FIG. 4). The bit lines (BLs) may include one or more bit lines, depending on the application, and the bit lines may be shared by both types UM and S or the different memory cells may have one or more independent bit lines. The word lines are separately addressable for the two memory types so that the memories can be used as completely separate memories, although memory cells for both memories are interleaved and within the same RAM chip.

The two memory cell types, UM and S, can be considered a dual bit cell that contains a copying mechanism. There are two interleaved memory planes, assembled from bit cells that contain two bits of information. One bit is the primary bit that corresponds to the normal RAM bit. The second bit is able to receive a copy and hold the primary value. When the copying mechanism is over, the two memory planes may act as two completely independent structures.

Figure 5:
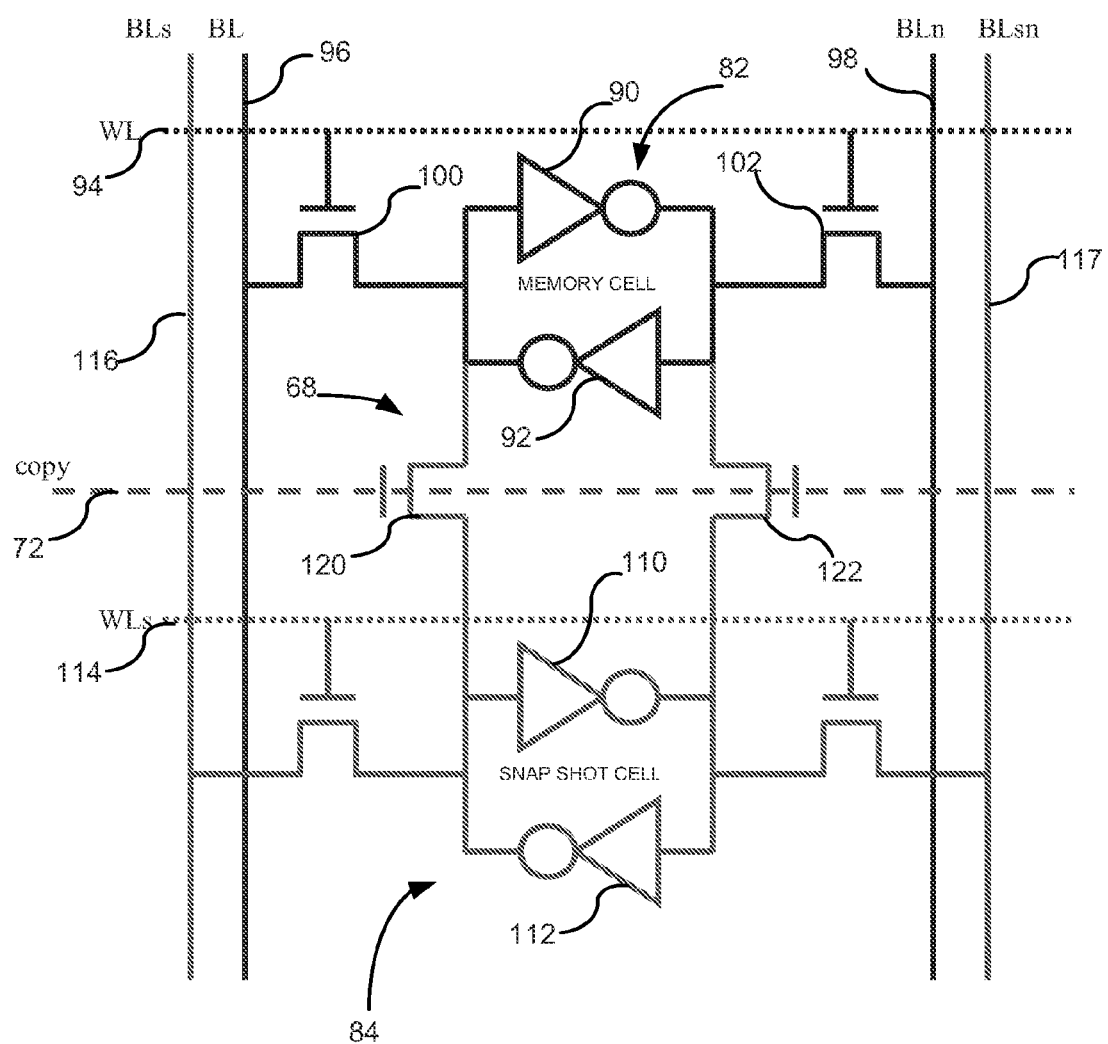
FIG. 5 is a hardware diagram showing further details of the memory cells of FIG. 4.

FIG. 5 shows an example of a user memory type cell 82 and a snapshot memory type cell 84 coupled together by transfer hardware 68. In this embodiment, memory cell 82 includes back-to-back inverters 90, 92 coupled together in a continuous loop. A first word line WL 94 allows data to be written to or read from memory cell 82 by switching on opposing transistors 100, 102 and allowing data to be driven from or received to bit lines BL 96 and BLn 98 (inverted BL). The word line WL 94 and bit lines BL 96, BLn 98 are accessible by the user model 64. The snapshot type memory cell 84 has a similar back-to-back inverter structure using inverters 110, 112. A second word line WLS 114 and separate bit lines 116, 117 allow access to the snapshot memory cell 84. The copy signal line 72 activates two transistors 120, 122 that form a switch and allow data to be copied from the user memory cell 82 to the snapshot memory cell 84. As described further below, there are many techniques to ensure that the data is copied from memory cell 82 to memory cell 84 and not vice versa. One technique is to ensure that user memory type cells are larger than snapshot type memory cells. By having separate word lines and separate bit lines, both memory cells 82, 84 can be operated independently of each other as they function as completely separate memories, although physically they are formed on the same silicon and located in the same chip. For example, the RAM may be used to perform a block copy of all the UM type memory cells to the S-type memory cells within one emulator clock cycle. The S-type memory cells may then be read at the same time that new data is being written to the UM memory cells without either memory portion disturbing the operation of the other portion. Thus, the UM-type memory cells represent the primary memory cells of the memory while the S-type memory cells represent an instantaneous copy of the primary memory cells. The instantaneous copy may thereafter be passed to the visibility system over many clock cycles to not overburden the visibility system.

Figure 6:
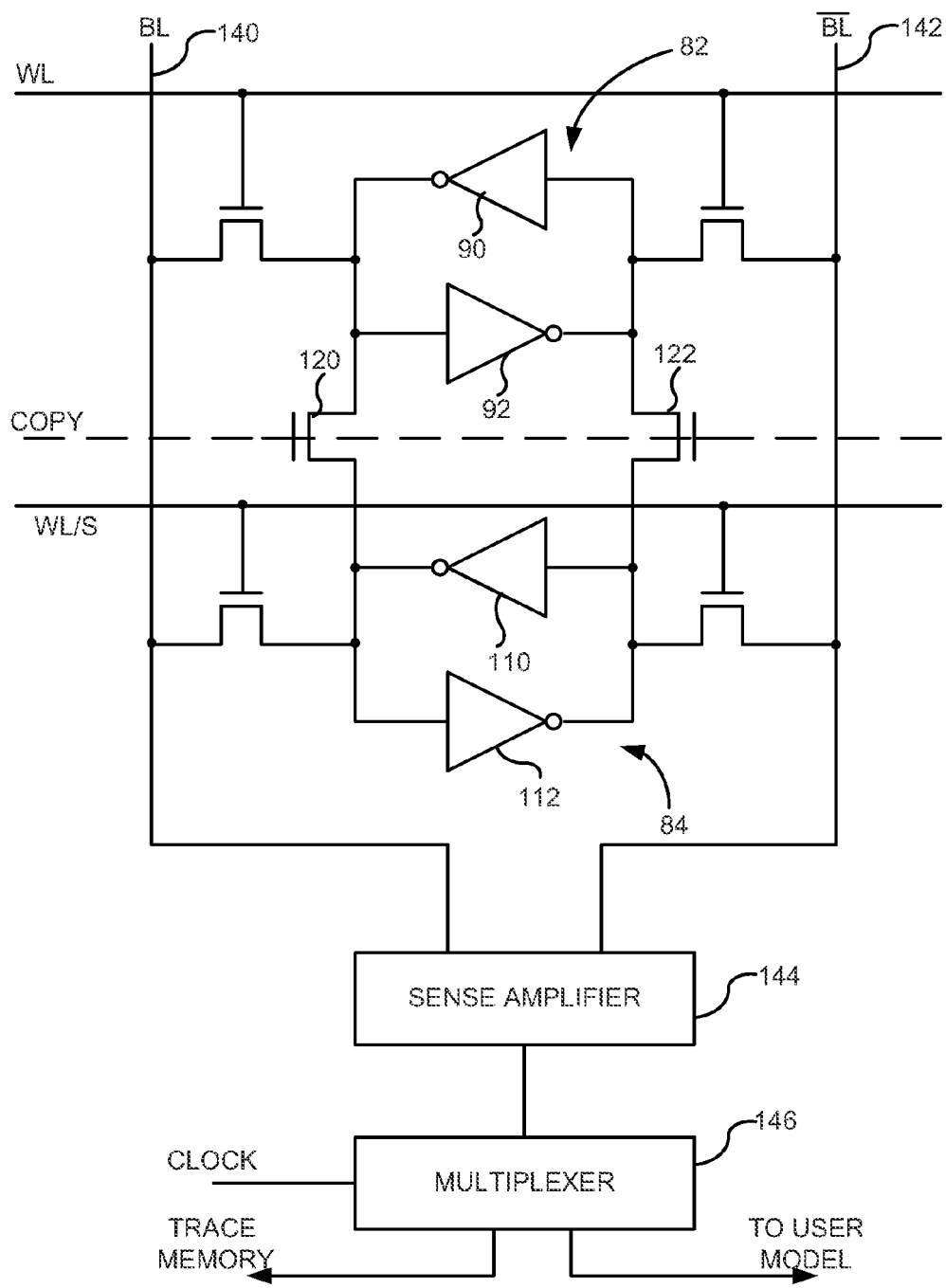
FIG. 6 is a second embodiment of the memory cell design.

FIG. 6 shows another embodiment of the memory cells 82, 84 but with shared bit lines BL 140 and BLn 142 (inverted). In this embodiment, in order to perform operations on both memory cells during the same clock cycle, a sense amplifier 144 is coupled to a multiplexer 146. The multiplexer 146 is switched every half clock cycle so that during one phase of the clock cycle the output of the memory output is coupled to the user model 64 and during the other half of the clock cycle, the memory output is coupled to the trace memory 46 in the visibility system 40. The timing of the word lines to each memory cell are similarly coordinated. Besides the reduction in the number of bit lines, in all other respects, the structure is similar to the structure already described in FIG. 5.

Figure 7:
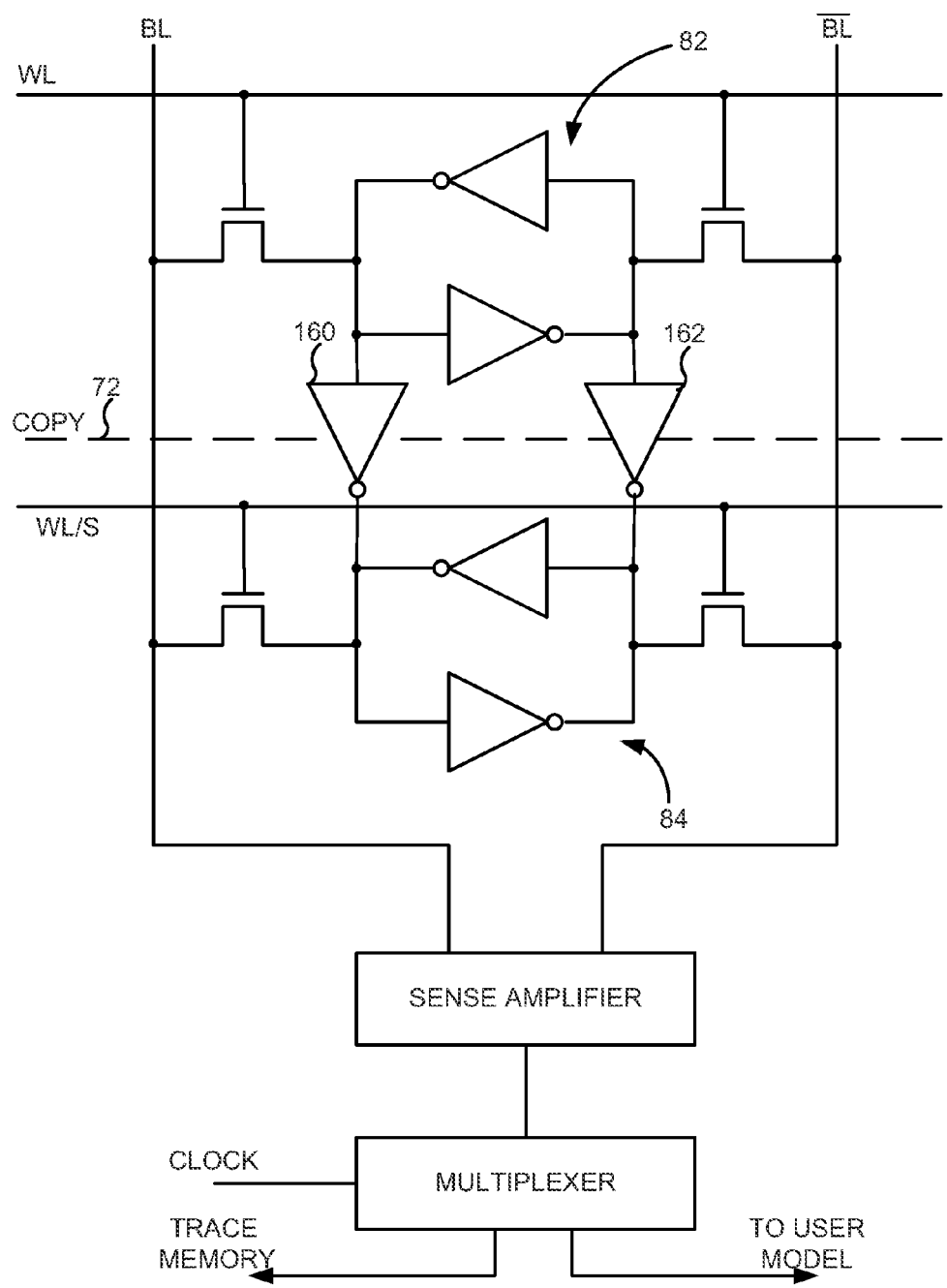
FIG. 7 is a third embodiment of the memory cell design.

FIG. 7 shows another embodiment of the memory cells 82, 84. This embodiment is similar to that described in FIG. 6. The two transistors 120, 122 in FIG. 6 are replaced in FIG. 7 with tristate gates 160, 162 having control lines coupled to the copy line 72. In this embodiment, the memory cells 82, 84 can be identical and there is no need for one to be larger than the other. The tristate gates can also be used with other embodiments, such as the embodiment of FIG. 5 with separate bit lines. Additionally, only one tristate gate can be used instead of two, similar to the one transistor switch shown in FIG. 8.

Figure 8:
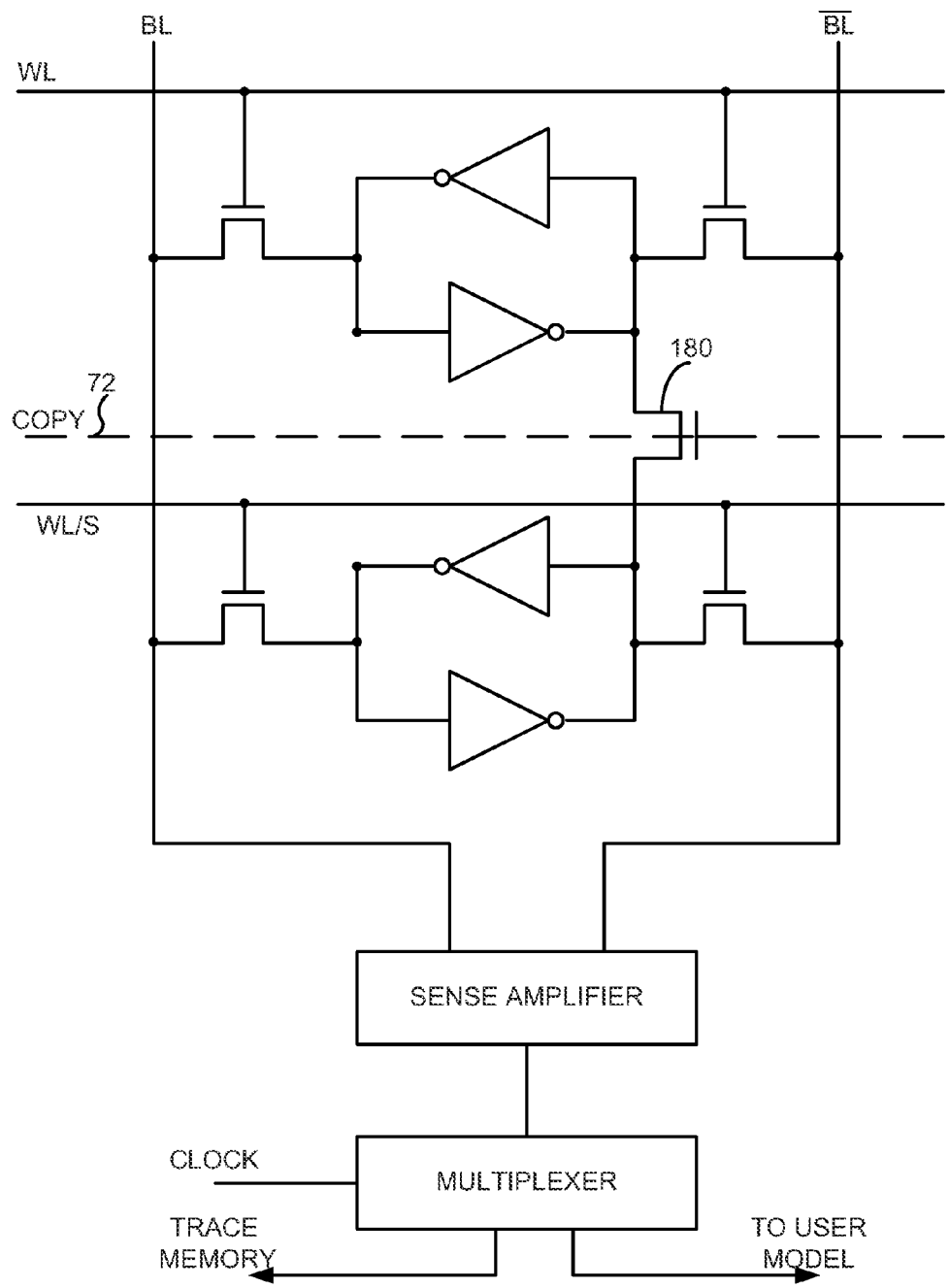
FIG. 8 is a fourth embodiment of the memory cell design.

FIG. 8 shows yet another embodiment of the memory cells 82, 84. The operation is similar to FIGS. 6 and 7, but the two transistors 120, 122 of FIG. 6 are replaced with a single transistor 180 having a gate coupled to the copy line 72. In all other respects, the circuit functions like the other embodiments already described. The single transistor 180 can be used with other embodiments, such as the embodiment of FIG. 5.

Figure 9:
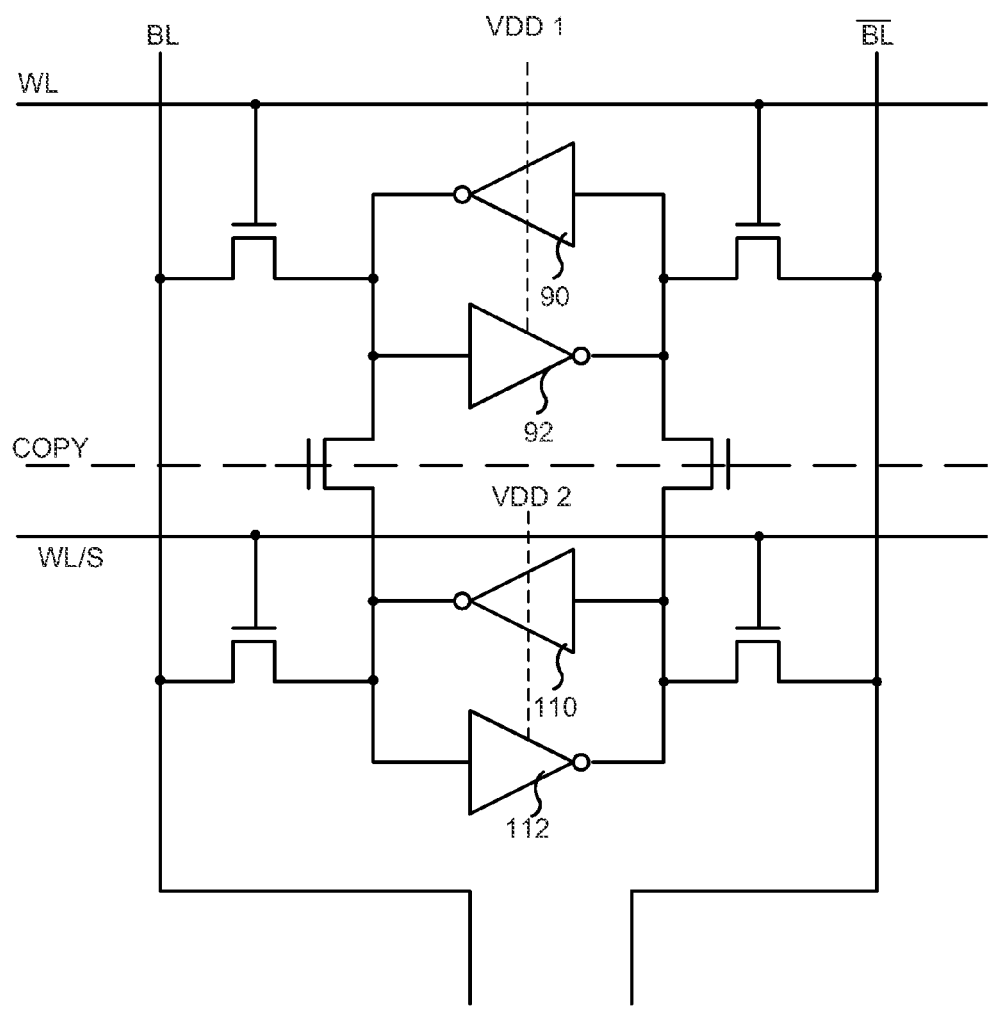
FIG. 9 is a fifth embodiment of the memory cell design.

FIG. 9 shows another embodiment similar to FIG. 5, but rather than having inverters 90, 92 larger than inverters 110, 112, in this embodiment the inverters 90, 92 are powered by a different power supply plane than inverters 110, 112. In particular, inverters 90, 92 are powered by Vdd1, while inverters 110, 112 are powered by Vdd2, which is of weaker voltage than Vdd1.

Figure 10:
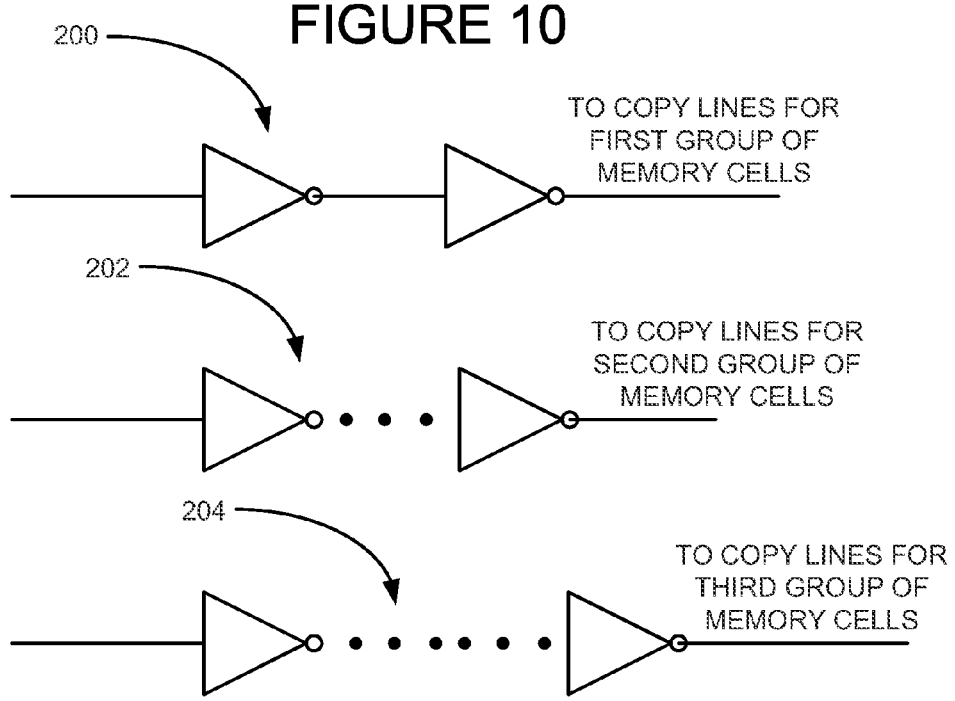
FIG. 10 is a hardware diagram showing a copy line used in conjunction with the memory cells.

FIG. 10 shows an example how the copy line 72 may be implemented within the transfer hardware 68. The copy line 72 may be coupled directly to all of the memory cells. However, due to power concerns of too many transistors switching at the same time, it may be desirable in certain applications to apply a delay to different groups of memory cells. Thus, the copy signal passes through delay 200 that includes two inverters coupled in series. This delayed version of the copy signal then passes to a first group of memory cells that copy the user memory type cells to the snapshot type cells. A second, longer delay 202, may be formed from any desired number of inverters (e.g., 4) and is coupled to a second group of memory cells. Finally, a third delay 204 is longer than the first and second delays and can be any desired number of inverters (e.g., 6 inverters). Other groupings and/or length of delay may be necessary depending on the particular application. The delays can be structured to ensure that all copies occur within a single emulator clock cycle. Alternatively, the copy can occur over several clock cycles. The copy signal structure of FIG. 10 can be used with any embodiment herein described.

Figure 11:
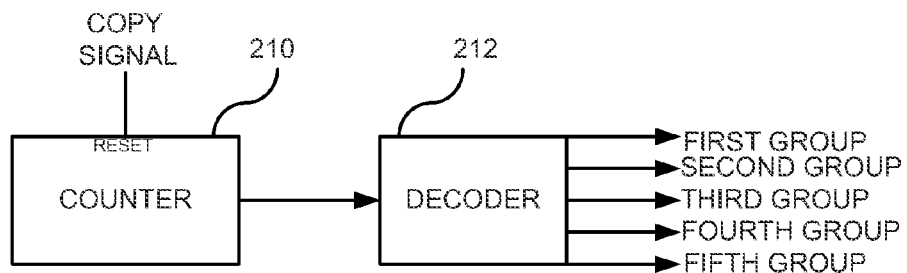
FIG. 11 is an alternative embodiment of a copy line used in conjunction with the memory cells.

FIG. 11 is another embodiment of how the copy line 72 may be implemented inside of the transfer hardware 68. In this embodiment, the copy signal line is supplied to the reset of a counter 210 having a clock input (not shown). The counter output is coupled to a decoder 212 that selects one of the groups of memory cells on each clock pulse. The copy signal structure of FIG. 11 can be used with any embodiment herein described.

FIG. 12 shows a flowchart of a method for using the RAM. In process block 220, a plurality of memory cells in the user model portion 66 of the RAM are written from the user model 64. Such writing may occur over many clock cycles. At a desired point in time, the copy signal 72 is activated (process block 222). In process block 224, the data within the user model portion 66 is copied into the snapshot portion 70 of the RAM. This copy may include all of the cells of the user model portion 66 and may occur in one emulation clock cycle. Alternatively, only some of the memory cells may be copied.

Having illustrated and described the principles of the illustrated embodiments, it will be apparent to those skilled in the art that the embodiments can be modified in arrangement and detail without departing from such principles.

Although only two memory types are shown, other memory types may easily be added to the memory array.

Although two different delay techniques are illustrated for the copy line, other delay techniques may readily be used.

Although memory cells are shown as back-to-back inverters, other types of memory cells well known in the art may also be used.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

I claim:

1. A Random Access Memory for use in a hardware emulator, comprising:
    an array of memory cells arranged in columns and in rows, wherein a memory cell in the array is coupled to at least one word line and at least one bit line; and
    a plurality of switches within the Random Access Memory, at least one of the switches coupled between two of the memory cells to allow data to be copied from one of the two memory cells to the other of the two memory cells;
    wherein the array of memory cells include a plurality of memory cells of a first type and a plurality of memory cells of a second type, the second type being different than the first type,
    wherein the memory including memory cells of the first type is accessible by a user model in the emulator and the memory cells of the second type are not accessible by the user model in the emulator.

2. The Random Access Memory of claim 1, wherein the Random Access Memory has alternating rows of memory cells of the first type and memory cells of the second type.

3. The Random Access Memory of claim 2, wherein the switches are coupled between memory cells of the first type and the memory cells of the second type in a one-to-one correspondence.

4. The Random Access Memory of claim 1, further including a copy signal line coupled to the plurality of switches to effectuate a copy of data between the memory cells.

5. The Random Access Memory of claim 1, wherein the plurality of memory cells of the first type and the plurality of memory cells of the second type represent two separate memories that share bit lines.

6. The Random Access Memory of claim 1, wherein each memory cell includes two inverters coupled in series to form a continuous loop.

7. The Random Access Memory of claim 1, wherein each of the switches includes one of the following alternatives:
    a) a single transistor with a gate coupled to a copy line;
    b) two transistors each having a gate coupled to a copy line; or
    c) at least one tri-state gate with its control input coupled to a copy line.

8. The Random Access Memory of claim 1, wherein memory cells of the second type include smaller inverters than the memory cells of the first type.

9. The Random Access Memory of claim 1, wherein memory cells of the second type are coupled to a power plane of weaker voltage than memory cells of the first type.

10. The Random Access Memory of claim 1, wherein each memory cell coupled to a common switch is also coupled to at least one bit line in common.

11. The Random Access Memory of claim 1, wherein each memory cell coupled to a common switch has separate bit lines.

12. The Random Access Memory of claim 1, further comprising a single copy line coupled to all of the switches in the memory to perform a block copy between all memory cells having a switch coupled therebetween.

13. The Random Access Memory of claim 1, further comprising a copy line coupled through various stages of delays to the plurality of switches to perform a block copy between all memory cells that have a switch coupled there between.

14. The Random Access Memory of claim 13, wherein the copy line is coupled to a counter that drives a decoder, the decoder coping data between different groups of memory cells in sequence.

15. The Random Access Memory of claim 1, wherein the Random Access Memory is located within the hardware emulator.

* * * * *

UNITED STATES PATENT AND TRADEMARK OFFICE
CERTIFICATE OF CORRECTION

| | | |
|---|---|---|
| PATENT NO. | : 8,259,517 B2 | Page 1 of 1 |
| APPLICATION NO. | : 12/854747 | |
| DATED | : September 4, 2012 | |
| INVENTOR(S) | : Peer Schmitt | |

It is certified that error appears in the above-identified patent and that said Letters Patent is hereby corrected as shown below:

In the claims
<u>Column 8</u>,
Line 37, Claim 14, "coping data" should be --copying data--.

Signed and Sealed this
First Day of December, 2015

Michelle K. Lee
*Director of the United States Patent and Trademark Office*